(12) United States Patent
Hiraoka et al.

(10) Patent No.: US 7,511,206 B2
(45) Date of Patent: Mar. 31, 2009

(54) CARBON NANOTUBES AND METHOD OF MANUFACTURING SAME, ELECTRON EMISSION SOURCE, AND DISPLAY

(75) Inventors: Hiroyuki Hiraoka, Kawasaki (JP); Yosuke Shiratori, Kawasaki (JP); Masahide Yamamoto, Kusatsu (JP); Shigeo Itoh, Mobara (JP); Kenji Nawamaki, Mobara (JP)

(73) Assignee: Futaba Corporation, Mobara-shi (JP)

( * ) Notice: Subject to any disclaimer, the term of this patent is extended or adjusted under 35 U.S.C. 154(b) by 556 days.

(21) Appl. No.: 11/267,314

(22) Filed: Nov. 7, 2005

(65) Prior Publication Data

US 2006/0054491 A1 Mar. 16, 2006

Related U.S. Application Data

(62) Division of application No. 10/252,668, filed on Sep. 24, 2002, now abandoned.

(30) Foreign Application Priority Data

Sep. 25, 2001 (JP) ............................. 2004-333529

(51) Int. Cl.
*D01F 9/127* (2006.01)
(52) U.S. Cl. .................. 977/844; 423/447.3; 977/952
(58) Field of Classification Search ............ 423/447.2, 423/447.3; 977/742, 842, 843, 844, 890, 977/932, 949, 950, 952
See application file for complete search history.

(56) References Cited

U.S. PATENT DOCUMENTS

| 6,250,984 | B1 | 6/2001 | Jin et al. |
| 6,628,053 | B1 * | 9/2003 | Den et al. .................. 313/310 |
| 6,863,942 | B2 | 3/2005 | Ren et al. |

OTHER PUBLICATIONS

Ishida et al., "Experimental study of fullerene-family formation using radio-frequency-discharge reactive plasmas," 2002, Thin Solid Films, 407, pp. 26-31.*
H. Murakami, et al., "Field Emission from Well-Aligned, Patterned, Carbon Nanotube Emitters," Mar. 27, 2000, Applied Physics Letters, vol. 76, No. 13, pp. 1776-1778.
D. S. Chung, et al., "Carbon Nanotube Electron Emitters with a Gated Structure using Backside Exposure Processes," May 27, 2002, Appled Physics Letters, Vol. 80, No. 21, pp. 4045-4047.

* cited by examiner

*Primary Examiner*—Wayne Langel
*Assistant Examiner*—Brittany M Martinez
(74) *Attorney, Agent, or Firm*—Oblon, Spivak, McClelland, Maier & Neustadt, P.C.

(57) ABSTRACT

The present invention provides carbon nanotubes perpendicularly and densely deposited over a wide area of a substrate. The carbon nanotubes are manufactured by supplying alternating-current power at a specific frequency between an anode and a cathode disposed in a reactor, and causing plasma to be generated between the anode and the cathode by introducing mixed gas containing an aliphatic hydrocarbon having 1-5 carbon atoms and hydrogen or mixed gas containing an aromatic hydrocarbon and hydrogen. The substrate is disposed between the anode and the cathode and held at a distance two times or less of the mean free path of a hydrocarbon cation from the anode.

10 Claims, 8 Drawing Sheets

CARBON NANOTUBES AND METHOD OF MANUFACTURING SAME, ELECTRON EMISSION SOURCE, AND DISPLAY

BACKGROUND OF THE INVENTION

1. Field of the Invention

The present invention relates to carbon nanotubes and a method of manufacturing the same, an electron emission source, and a display.

2. Description of Background Art

Conventionally, a field electron emission source in which emitters are disposed between a cathode electrode and a gate electrode and electrons are emitted from the emitters by applying a voltage between the cathode electrode and the gate electrode has been developed.

The field electron emission source has excellent features such as low power consumption and long lifetime in comparison with an electron source which utilizes thermal energy (thermionic emission source). As a material widely used for the electron emission source, semiconductors such as silicon (Si), metals such as tungsten (W) and molybdenum (Mo), a polycrystalline diamond thin film, and the like are known.

When an electric field of about $10^9$ V/m is applied to the surface of a metal or a semiconductor, electrons pass through a barrier using a tunneling effect, whereby the electrons are emitted under vacuum even at ordinary temperature (field emission phenomenon). Therefore, the extracting current is determined depending upon the electric field applied to an emission section (emitter) from an extracting electrode section (gate electrode). It is known in the art that a field intensity applied to the emitter is increased as the tip of the emitter becomes sharper. Therefore, it is necessary to process the tip of the electron emission section formed of a semiconductor or a metal into the shape of a sharp needle.

In order to enable stable field emission, the operational atmosphere must be maintained at high vacuum of $133 \times 10^{-8}$ Pa or more.

Carbon nanotubes have attracted attention as a material for the electron emission source from the above point of view. The outer diameter and the length of the carbon nanotubes are 10 to several tens of nanometers and several microns, respectively. Therefore, the carbon nanotubes have a structure which enables field emission at a low voltage. Moreover, carbon is chemically stable and has mechanical strength. Because of this, the carbon nanotube is an ideal emitter material.

However, since the carbon nanotubes are manufactured by using an arc discharge method or laser irradiation to graphite and used after purification, there have been the following problems.

A conventional manufacturing method for the carbon nanotubes incurs considerable cost. Moreover, yield of the carbon nanotubes is extremely low due to a high content of impurities. Therefore, cost of the resulting carbon nanotubes is inevitably increased. This makes an electron emission source manufactured by using the carbon nanotubes unprofitable.

There may be a case where a paste of carbon nanotubes is printed on a specific electrode as the electron emission source. However, the carbon nanotubes are aligned parallel to the substrate after printing due to viscosity of a solvent of the printing paste or additives. This results in problems such as an insufficient field emission effect, an increase in extracting voltage, and a decrease in extracting current.

As a method of directly depositing the carbon nanotubes on the substrate, a microwave plasma method and a direct current plasma method have been proposed. However, it is difficult to uniformly deposit the carbon nanotubes over a wide area of the substrate by using these methods. Moreover, the temperature of the substrate is inevitably increased in order to deposit the carbon nanotubes in a plasma stream at about 133 Pa. This makes it difficult to use a substrate having a softening point of about 500° C.

The present invention has been achieved to solve the above conventional problems.

Accordingly, an object of the present invention is to provide carbon nanotubes which are perpendicularly deposited on a substrate and manufactured without excessively increasing the temperature of the substrate.

Another object of the present invention is to provide a method of manufacturing carbon nanotubes which are uniformly deposited over a wide area, have a regular crystal structure, and are aligned perpendicularly to a substrate, even if the temperature of the substrate is 500° C. or less.

Still another object of the present invention is to provide an electron emission source excelling in electron emission characteristics obtained by using the carbon nanotubes.

Yet another object of the present invention is to provide a display using the electron emission source.

SUMMARY OF THE INVENTION

In order to achieve the above objects, the present invention provides carbon nanotubes perpendicularly and densely deposited on a substrate, which are obtained by plasma processing in which the temperature of the substrate is maintained at about 500° C. or less. Since the carbon nanotubes according to the present invention are perpendicularly and densely deposited on the substrate, the carbon nanotubes exhibits an excellent field emission-effect. Moreover, since the carbon nanotubes are manufactured by plasma processing in which the temperature of the substrate is maintained at about 500° C. or less, a substrate having a low softening point such as a glass substrate can be used.

The present invention also provides a method of manufacturing carbon nanotubes comprising supplying alternating-current power at a specific frequency between an anode and a cathode disposed in a reactor, and causing plasma to be generated between the anode and the cathode by introducing mixed gas containing an aliphatic hydrocarbon having 1-5 carbon atoms and hydrogen or mixed gas containing an aromatic hydrocarbon and hydrogen, thereby allowing carbon nanotubes to be deposited on a substrate disposed between the anode and the cathode and held at a distance two times or less of the mean free path of a hydrocarbon cation from the anode.

In the method of manufacturing carbon nanotubes according to the present invention, the distance between the anode and the substrate is preferably 20 cm or less, and still more preferably 10 cm or less.

In the method of manufacturing carbon nanotubes according to the present invention, the specific frequency is preferably 13.56 MHz.

In the method of manufacturing carbon nanotubes according to the present invention, the aliphatic hydrocarbon having 1-5 carbon atoms may be a saturated aliphatic hydrocarbon having 1-5 carbon atoms or an unsaturated aliphatic hydrocarbon having 1-5 carbon atoms. The aromatic hydrocarbon may be benzene, toluene, or xylene.

In the method of manufacturing carbon nanotubes according to the present invention, a metal, an alloy, a metal complex, or a metal compound is preferably caused to adhere to the substrate as a catalyst. The catalyst is preferably at least one of a metal, an alloy, or a metal compound of iron, cobalt, nickel, tungsten, platinum, rhodium, and palladium.

In the method of manufacturing carbon nanotubes according to the present invention, a magnetic field is preferably applied by disposing a magnet so that magnetic force occurs in a direction perpendicular to the substrate.

In the method of manufacturing carbon nanotubes according to the present invention, the pressure of the mixed gas is preferably 1 to 50 Pa.

The present invention also provides an electron emission source in which emitters are disposed between a cathode electrode and a gate electrode and electrons are emitted from the emitters by applying a voltage between the cathode electrode and the gate electrode, wherein the emitters comprise the above carbon nanotubes. According to the present invention, a field emission source excelling in electron emission characteristics can be provided by forming the emitters using the above carbon nanotubes.

The present invention further provides a display comprising the above electron emission source. An excellent flat display can be manufactured by using the field emission source of the present invention as an electron emission source of a field emission display.

Other objects, features, and advantages of the present invention will hereinafter become more readily apparent from the following description.

DETAILED DESCRIPTION OF PREFERRED EMBODIMENT

Carbon nanotubes and a method of manufacturing the same, an electron emission source, and a display according to an embodiment of the present invention are described below.

The carbon nanotubes according to the present invention are perpendicularly and densely deposited on a substrate. The carbon nanotubes are manufactured by supplying alternating-current power at a specific constant frequency between two electrodes (anode and cathode) disposed in a reactor, and causing plasma to be generated between the anode and the cathode by introducing mixed gas containing an aliphatic hydrocarbon having 1-5 carbon atoms ($C_1$-$C_5$) and hydrogen or mixed gas containing an aromatic hydrocarbon and hydrogen, thereby allowing carbon nanotubes to be deposited on a substrate disposed between the anode and the cathode and held at a distance two times or less of the mean free path of a hydrocarbon cation from the anode.

Specifically, the carbon nanotubes are directly deposited over a wide area of the substrate at specific positions with high resolution at a comparatively low temperature of 500° C. or less by applying electric power at a specific frequency between the anode and the cathode and introducing a $C_1$-$C_5$ aliphatic hydrocarbon and hydrogen or an aromatic hydrocarbon and hydrogen so as to be reacted in plasma.

In this case, the carbon nanotubes can be uniformly deposited for a short period of time by causing a metal, an alloy, a metal complex, or a metal compound to adhere to the substrate as a catalyst in the area in which the carbon nanotubes are deposited. Moreover, the carbon nanotubes can be directly deposited at desired positions with high resolution.

Plasma density can be increased and alignment of the carbon nanotubes in the direction perpendicular to the substrate can be promoted by applying a magnetic field at a specific strength by disposing a magnet so that magnetic force occurs in the direction perpendicular to the substrate. The resulting carbon nanotubes have a regular crystal structure and adhere to the substrate while being aligned perpendicularly to the substrate.

In the present embodiment, it is important to dispose the anode and the substrate at a distance two times or less of the mean free path of a hydrocarbon cation. If the distance between the anode and the substrate exceeds two times the mean free path of a hydrocarbon cation, the growth rate of the carbon nanotubes is decreased. In more detail, the distance between the anode and the substrate is 20 cm or less, and preferably 10 cm or less taking into consideration the pressure, bias voltage, and the like under usual formation conditions for carbon nanotubes.

This enables occurrence of collision between hydrocarbon cations to be minimized by causing plasma to be generated in a state in which the concentration of hydrocarbon molecules is as low as possible, whereby the carbon nanotubes can be efficiently and rapidly produced. Moreover, the carbon nanotubes can be grown perpendicularly to the substrate.

Density of plasma generated in the reactor is decreased by decreasing the concentration of hydrocarbon molecules, specifically, by setting the pressure of the mixed gas at 1-50 Pa, and preferably 1-20 Pa. This prevents an increase in the temperature of the substrate. Therefore, the temperature of the substrate can be maintained at 500° C. or less. This enables utilization of a low-melting-point glass substrate such as soft glass as the substrate.

For example, a case of using acetylene as a hydrocarbon under conditions employed in Example 1 is described below.

In the case of single gas, the mean free path λ of a molecule is shown by the following equation.

$$\lambda = kT/(\pi P \sigma^2 \sqrt{2}) \qquad (1)$$

wherein k=Boltzmann constant ($1.38066 \times 10^{-23}$ $JK^{-1}$), T=temperature of surface of substrate (absolute temperature K), σ=collision diameter (nm) of molecule, and P=partial pressure (Pa) of gas in reactor (chamber).

The concentration of acetylene is very low in the plasma formation conditions employed in Example 1, since acetylene is diluted with hydrogen and is at low pressure. Therefore, the mean free path of an acetylene molecule in the actual plasma formation conditions can be roughly calculated by using the equation (1).

Specifically, collision between acetylene molecules is ignored in comparison with collision between acetylene and hydrogen, since the concentration of acetylene gas is low. The collision diameter σ of molecules in the equation (1) is considered to be the sum of the collision diameters of acetylene and hydrogen.

The collision diameters of acetylene and hydrogen are respectively about 0.24 nm and about 0.14 nm. Therefore, the collision diameter σ is 0.38 nm.

The mean free path λ of acetylene at a substrate temperature of 400° C. (measured value) and a pressure of acetylene-hydrogen mixed gas of 10 Pa calculated according to the equation (1) is about 0.15 cm.

Since acetylene is ionized in the plasma conditions and a bias voltage of −50 V is applied between the anode and the cathode, an acetylene cation has an energy of 50 eV. The kinetic energy of acetylene is 0.1 eV (3 kT/2 at 400° C.=0.1 eV) Therefore, an acetylene cation has an energy 500 times the energy of the acetylene molecule (50 eV/0.1 eV) ($\sqrt{500}$ times (about 22 times) in speed).

Therefore, the mean free path of an acetylene cation is 0.15 cm×22=3.3 cm at a mixed gas pressure of 10 Pa.

It is preferable that the number of collisions between an acetylene cation and other molecules before the acetylene cation reaches the substrate be as small as possible from the viewpoint of formation of the carbon nanotubes. If these considerations are applied to hydrocarbons used in the present embodiment other than acetylene, the mean free path of a hydrocarbon cation is estimated to be about 5 to 15 cm.

Therefore, the target is attained by holding the substrate at a distance of 20 cm or less, and preferably 10 cm or less from the anode.

Since this value relates to the pressure P, specifically, the internal pressure of the mixed gas as shown in the equation (1), it is important to maintain the pressure P as small as possible (increase the degree of decompression).

The $C_1$-$C_5$ aliphatic hydrocarbon used in the present embodiment includes a saturated aliphatic hydrocarbon and an unsaturated aliphatic hydrocarbon. These hydrocarbons may be used either individually or in combination of two or more. As examples of $C_1$-$C_5$ aliphatic hydrocarbons, methane, ethane, propane, n-butane, i-butane, n-pentane, i-pentane, and the like can be given. Since the collision diameter of a methane cation is 0.2 nm, the mean free path λ of a methane cation is 8.0 cm at 5 Pa. This does not significantly affect the distance between the anode and the substrate.

$C_1$-$C_5$ unsaturated aliphatic hydrocarbons have a double bond and/or a triple bond. As examples of $C_1$-$C_5$ unsaturated aliphatic hydrocarbons, a monoolefin, diolefin, conjugated diolefin, acetylene, and the like may be used.

As the monoolefin, ethylene, propylene, butene-1, butene-2, isobutylene, pentene-1, pentene-2, and the like may be used. As the diolefin, penta-1,4-diene may be used. As the conjugated diolefin, butadiene, isoprene, and the like may be used. As the acetylene, acetylene, propyne-1, butyne-1, and the like may be used.

As aromatic hydrocarbons, benzene, toluene, xylene, and the like may be used.

As $C_1$-$C_5$ aliphatic hydrocarbons, methane, ethane, ethylene, butadiene, acetylene, and the like are particularly preferable.

As aromatic hydrocarbons, benzene and toluene are particularly preferable.

Use of $C_1$-$C_5$ aliphatic hydrocarbon or aromatic hydrocarbon enables the carbon nanotubes to be manufactured at a low temperature and a high formation rate.

As a catalyst, a metal, an alloy, or a metal compound of iron, cobalt, nickel, tungsten, platinum, rhodium, and palladium, and the like may be used. Of these, a metal, an alloy, or a metal compound of iron, cobalt, or nickel is particularly preferable. These catalysts may be used either individually or in combination of two or more. These catalysts may be caused to adhere to the substrate by deposition, printing, coating, an ink-jet method, or the like. In particular, it is preferable to use nanoparticles of these catalysts when using printing, coating, an ink-jet method, or the like.

The frequency of an alternating-current power supply used to generate plasma may be a constant frequency of 13.56 MHz. However, the frequency is not limited to 13.56 MHz.

It is preferable to dispose a magnet so that magnetic force occurs in the direction perpendicular to the substrate in order to increase plasma density and promote alignment of the carbon nanotubes in the direction perpendicular to the substrate. In more detail, the magnet is disposed on the top and/or bottom or the side of the substrate. There are no specific limitations to the magnetic field. The magnetic field is preferably about 100-10,000 G.

In order to ensure that magnetic force uniformly occurs in the direction perpendicular to a large substrate, a fixed permanent magnet may be disposed so that a magnetic field is applied between the cathode and the anode. The magnetic field may be caused to occur uniformly between the cathode and the anode by rotating the permanent magnet.

A conventional formation temperature for the carbon nanotubes is about 550° C. at a gas pressure of 133-1330 Pa in the case of using a direct current plasma method or a microwave plasma method. Therefore, soft glass cannot be used as the substrate at such a high temperature. In the present embodiment, the carbon nanotubes can be perpendicularly deposited over a wide area of the substrate with high resolution even at a low temperature of 500° C. or less. Moreover, the resulting carbon nanotubes have a regular crystal structure. Therefore, the carbon nanotubes can be easily deposited on a substrate having a low melting point.

Figure 1:
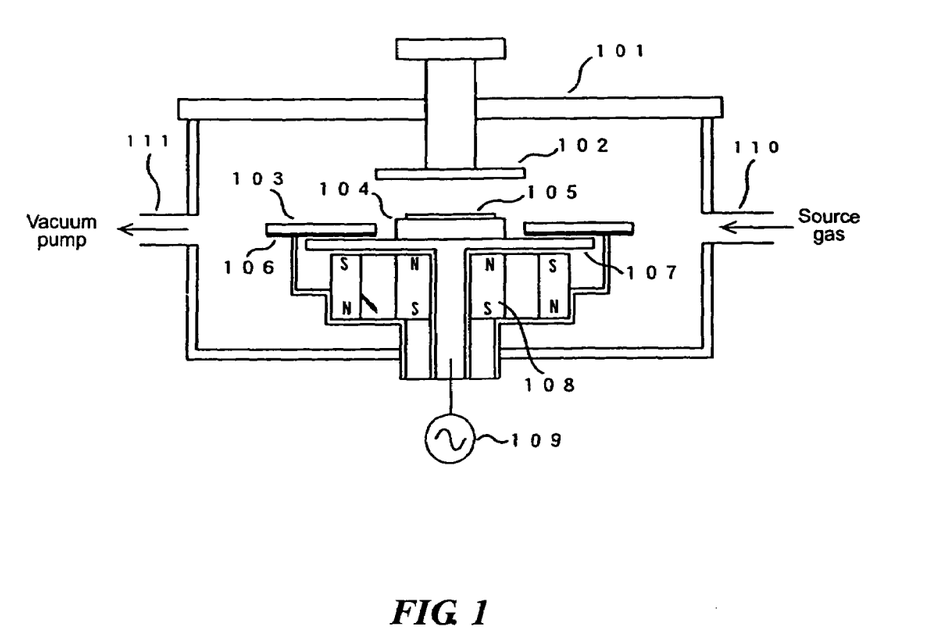
FIG. 1 is a view showing an apparatus for manufacturing carbon nanotubes used in an embodiment of the present invention.

FIG. 1 is a view showing an example of an apparatus for manufacturing the carbon nanotubes used in the present embodiment. The apparatus shown FIG. 1 was used in each example described later. In FIG. 1, 101 indicates a reactor (chamber), 102 indicates an anode, 103 indicates a stainless steel ring, 104 indicates a sample base made of stainless steel, 105 indicates a substrate, 106 indicates a Teflon ring, 107 indicates a cathode, 108 indicates a permanent magnet, and 109 indicates an alternating-current power supply at a frequency of 13.56 MHz. The alternating-current power supply 109 causes plasma to be generated between the anode 102 and the cathode 107. The permanent magnet 108 produces a magnetic field for causing high-density plasma to be generated near the substrate 105. Source gas is supplied from a tube 110, passes through the reactor 101, and is guided to a vacuum pump (not shown) through a tube 111.

In the case of producing the carbon nanotubes in the reactor 101, alternating-current power at a constant frequency (13.56 MHz in the present embodiment) is supplied between the two electrodes (anode 102 and cathode 107) from the alternating-current power supply 109. The inside of the reactor 101 is maintained at a specific pressure by discharging mixed gas containing an aliphatic hydrocarbon having 1-5 carbon atoms ($C_1$-$C_5$) and hydrogen or an aromatic hydrocarbon and hydrogen from the tube 110 through the tube 111 and the reactor 101. Plasma is generated between the anode 102 and the cathode 107 in this state, whereby the carbon nanotubes are formed on the substrate 105. The substrate 105 is disposed between the anode 102 and the cathode 107 and held at a distance of 10 cm or less from the anode 102.

Reaction gases are introduced into the reactor 101 from the tube 110 as source gas. The reaction gases are reacted in plasma and deposited on the substrate 105 placed on the sample base 104. The source gas has a composition in which 0.5-20 vol of a $C_1$-$C_5$ aliphatic hydrocarbon or aromatic hydrocarbon is mixed with 100 vol of hydrogen, for example. The flow rate is 10-100 sccm/s, for example. However, the flow rate may differ depending on the size of the reactor. The output of the alternating-current power supply 109 is 50-1000 W, for example. The pressure inside the reactor 101 is preferably 1-50 Pa. −5 to −500 V is preferably applied to the cathode 107 as a bias potential with respect to the anode 102.

The growth rate of the carbon nanotubes is decreased if an insulation substance such as glass is used as the substrate 105. However, the growth rate of the carbon nanotubes is increased by maintaining a catalyst layer on the surface of the substrate and the cathode at the same voltage. Since the catalyst layer on the surface of the substrate and the cathode are at the same potential, electrons are smoothly supplied to the surface of the catalyst. This prevents occurrence of charge-up on the surface of the substrate due to a cation, whereby environment which enables a cation to easily attack is maintained. Therefore, the growth rate of the carbon nanotubes is increased. In this case, it is necessary to maintain the catalyst layer on the surface of the substrate and the cathode in an electrically conducting state by winding a conductor such as aluminum foil on the periphery of the substrate, for example.

When a voltage was applied to carbon nanotubes deposited on an appropriate substrate under vacuum, it was confirmed that current flowed through the carbon nanotubes. Multi-walled carbon nanotubes manufactured by using the method of the present embodiment are deposited on the substrate in a state in which the carbon nanotubes are aligned perpendicularly to the substrate. Therefore, the carbon nanotubes are extremely suitably used as emitters for an electron emission source.

As described above, according to the present embodiment, carbon nanotubes perpendicularly and densely deposited on a substrate can be efficiently manufactured. The carbon nanotubes are uniformly deposited over a wide area of the substrate with high resolution.

According to the present embodiment, a method of manufacturing carbon nanotubes having characteristics in which deposited carbon nanotubes have a regular crystal structure, are uniformly deposited over a area, and are aligned perpendicularly to the substrate, even if the temperature of the substrate is 500° C. or less, can be provided.

According to the present embodiment, a field emission source excelling in electron emission characteristics, in which emitters are disposed between a cathode conductor and a gate electrode and electrons are emitted from the emitters by applying a voltage between the cathode conductor and the gate electrode, can be provided by forming the emitters using the carbon nanotubes manufactured by the above method.

Figure 8:
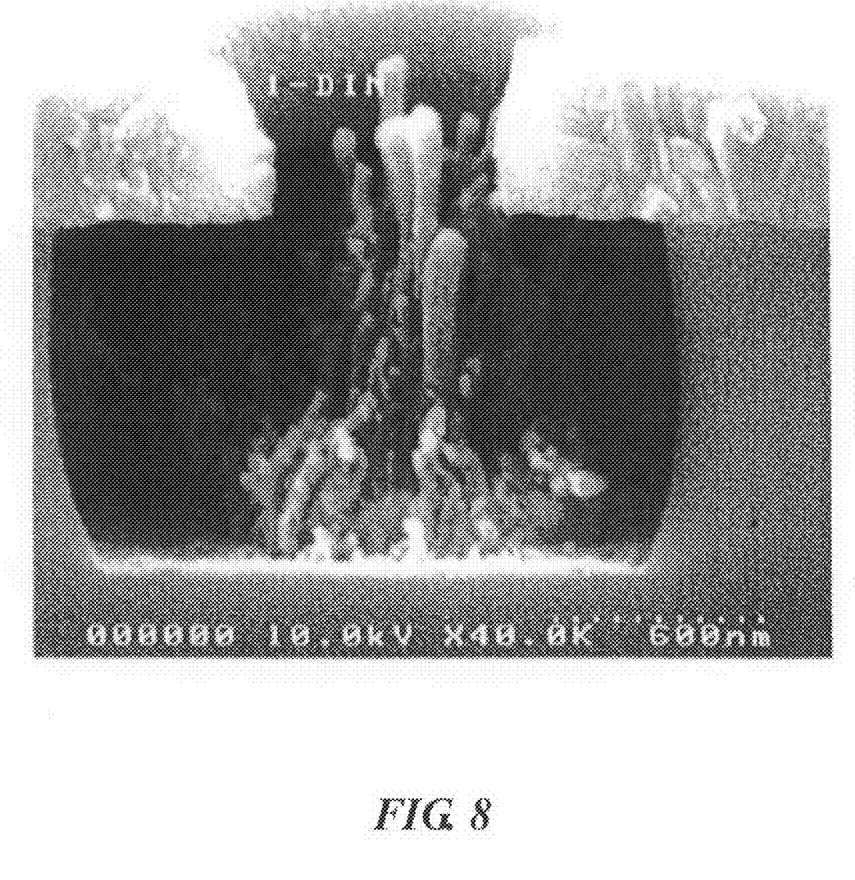
FIG. 8 shows an SEM photograph showing carbon nanotubes grown on a substrate.

An excellent flat display can be manufactured by using the field emission source thus obtained as an electron emission source of a field emission display. FIG. 8 shows an SEM photograph showing carbon nanotubes grown on a substrate of a display by using the above method.

EXAMPLES

The present invention is described below in more detail by examples. However, these examples should not be construed as limiting the present invention.

Example 1

Carbon nanotubes were deposited under conditions given below by using the manufacturing apparatus shown in FIG. 1. Acetylene was used as an unsaturated hydrocarbon.

Flow rate of hydrogen gas (sccm/s): 23.0
Flow rate of acetylene gas (sccm/s): 0.4
RF (frequency) power (W): 360
Pressure inside reactor (Pa): 10
Bias potential (V): −50

Figure 2:
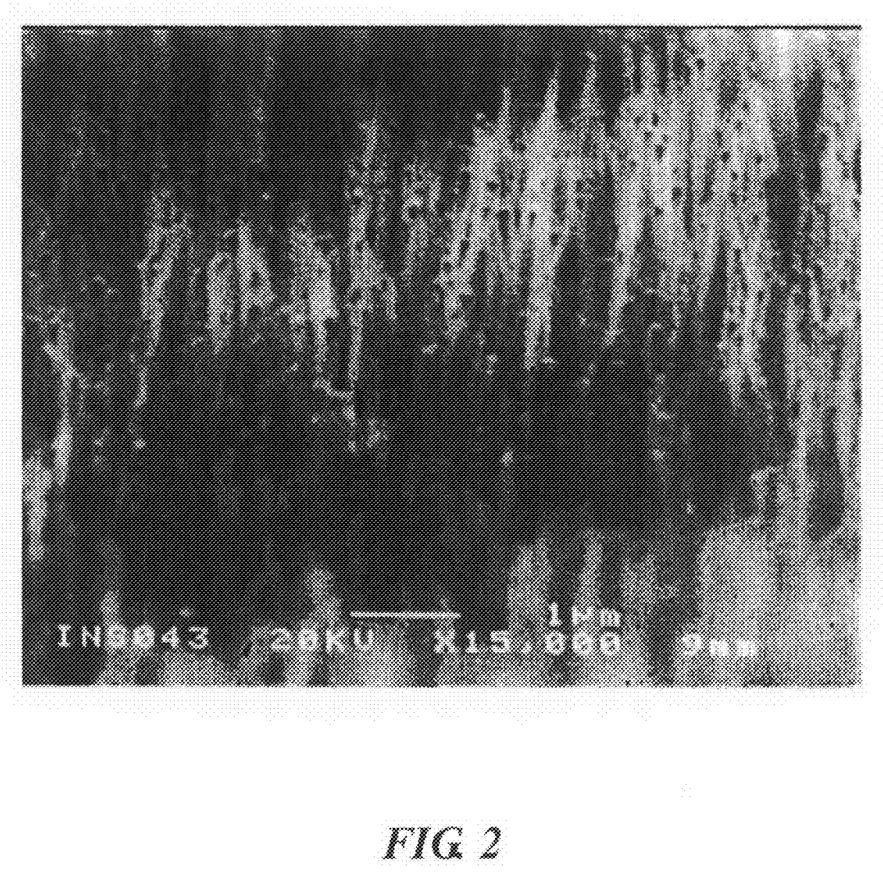
FIG. 2 is an SEM photograph showing carbon nanotubes manufactured in Example 1 of the present invention.

The distance between the anode 102 and the substrate 105 was 8 cm. As the substrate 105, a substrate obtained by depositing chromium on soda-lime glass and further depositing nickel on chromium was used. Carbon nanotubes were deposited for 60 minutes. FIG. 2 shows an SEM photograph of the resulting carbon nanotubes. As shown in FIG. 2, the carbon nanotubes were perpendicularly and densely deposited on the substrate 105.

Figure 3:
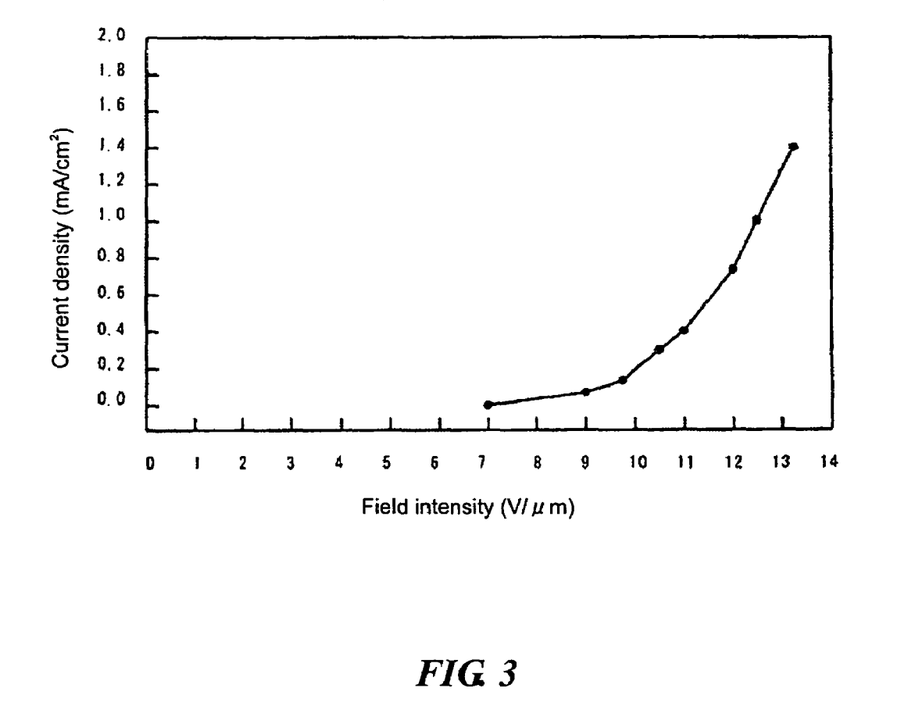
FIG. 3 is a characteristic chart of a field intensity-current density curve of the carbon nanotubes manufactured in Example 1 of the present invention

FIG. 3 is a characteristic Chart showing results for a field intensity-current density curve measured using the substrate 105 on which the carbon nanotubes were deposited. The maximum current density was 1.4 mA/cm².

Example 2

Figure 4:
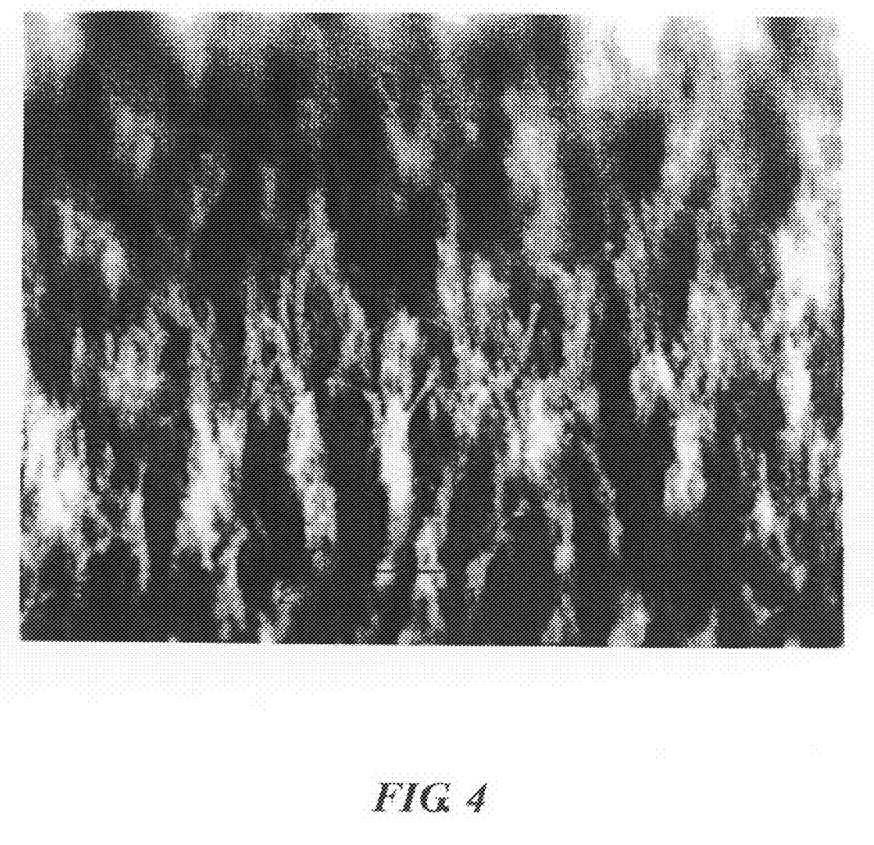
FIG. 4 is an SEM photograph showing carbon nanotubes manufactured in Example 2 of the present invention.

An experiment was conducted under the same conditions (distance between the anode and the substrate and the like) as in Example 1. However, a substrate obtained by causing iron, which functions as a catalyst during formation of carbon nanotubes, to adhere to a copper substrate was used as the substrate 105.

Iron was caused to adhere to the copper substrate as follows. Specifically, after applying isopropyl alcohol containing 5% ferric (II) nitrate $(Fe(NO_3)_3 \cdot 9H_2O)$ to the copper substrate, ferric (II) nitrate was reduced to iron by hydrogen plasma processing (processing conditions: pressure; 8 Pa, output of alternating-current power supply 109; 400 W, bias potential; −40 to −70V, processing time; 10 min.).

FIG. 4 shows an SEM photograph of the resulting carbon nanotubes. As shown in FIG. 4, the carbon nanotubes were perpendicularly and densely deposited on the substrate 105. A current-voltage curve was measured by using this substrate. As a result, the maximum current density was 0.7 mA/cm².

Example 3

An experiment was conducted under the same conditions (distance between the anode and the substrate and the like) as in Example 1. However, a substrate obtained by causing cobalt, which functions as a catalyst during formation of carbon nanotubes, to adhere to a copper substrate was used as the substrate 105.

Cobalt was caused to adhere to the copper substrate as follows. Specifically, after applying isopropyl alcohol containing 5% cobalt (II) nitrate $(Co(NO_3)_2 \cdot 6H_2O)$ to the copper substrate, cobalt (II) nitrate was reduced to cobalt by hydrogen plasma processing (processing conditions: pressure; 8 Pa, output of alternating-current power supply 109; 400 W, bias potential; −40 to −70V, processing time; 10 min.).

Figure 5:
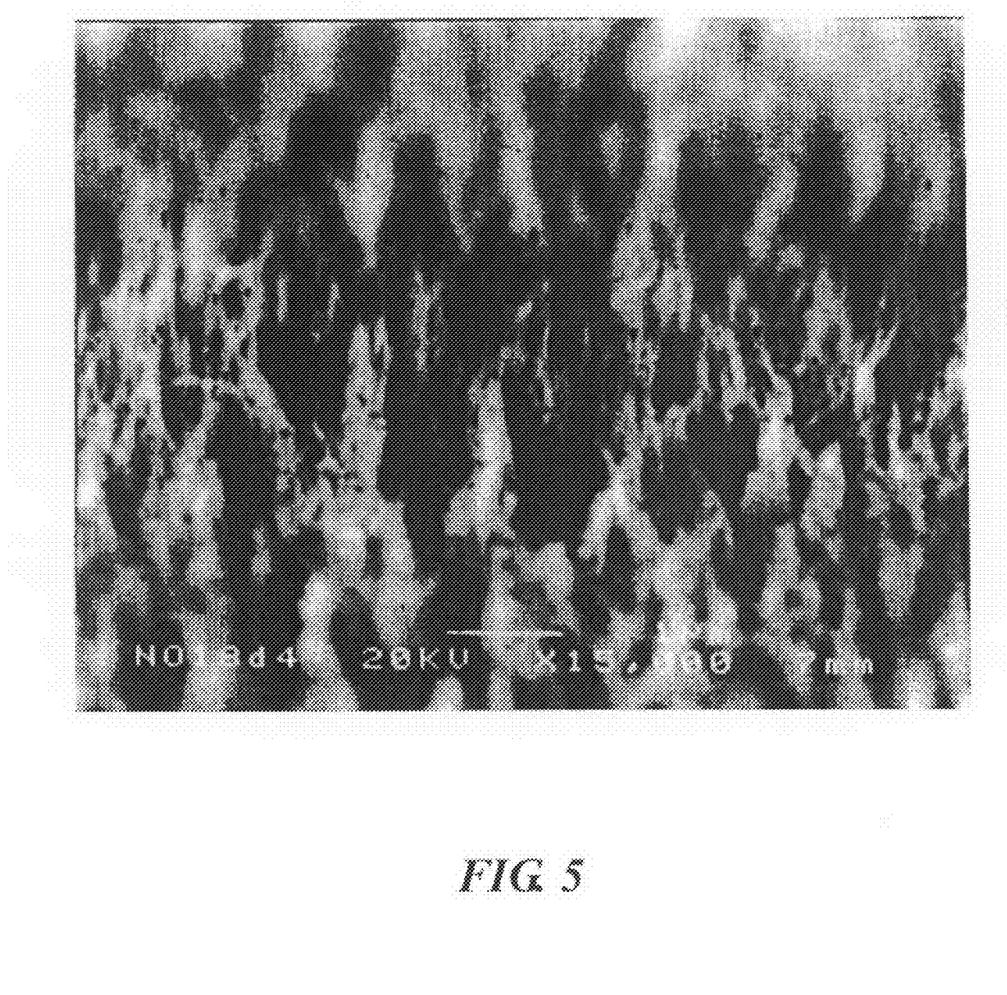
FIG. 5 is an SEM photograph showing carbon nanotubes manufactured in Example 3 of the present invention.

FIG. 5 shows an SEM photograph of the resulting carbon nanotubes. As shown in FIG. 5, the carbon nanotubes were perpendicularly and densely deposited on the substrate 105. A current-voltage curve was measured by using this substrate. As a result, the maximum current density was 0.6 mA/cm$^2$.

Example 4

An experiment was conducted under the same conditions (distance between the anode and the substrate and the like) as in Example 1. However, a substrate obtained by depositing chromium on soda-lime glass, depositing copper on chromium, and further depositing nickel on copper was used as the substrate 105.

The deposition state of carbon nanotubes was the same as that shown in FIG. 2. A current-voltage curve was measured by using the substrate 105. As a result, the maximum current density was 1.8 mA/cm$^2$. Therefore, emission characteristics were improved in comparison with Examples 1-3.

Example 5

An experiment was conducted under the same conditions (distance between the anode and the substrate and the like) as in Example 1. However, ethylene gas was used instead of acetylene gas. The deposition state of carbon nanotubes was the same as that shown in FIG. 2.

Example 6

An experiment was conducted under the same conditions (distance between the anode and the substrate and the like) as in Example 1. However, methane gas was used instead of acetylene gas. The experimental conditions were as follows.

Flow rate of hydrogen gas (sccm/s): 20
Flow rate of methane gas (sccm/s): 0.4
Output power (W) of AC power supply 109: 400
Pressure inside chamber (Pa): 12
Deposition time (min): 120

Figure 6:
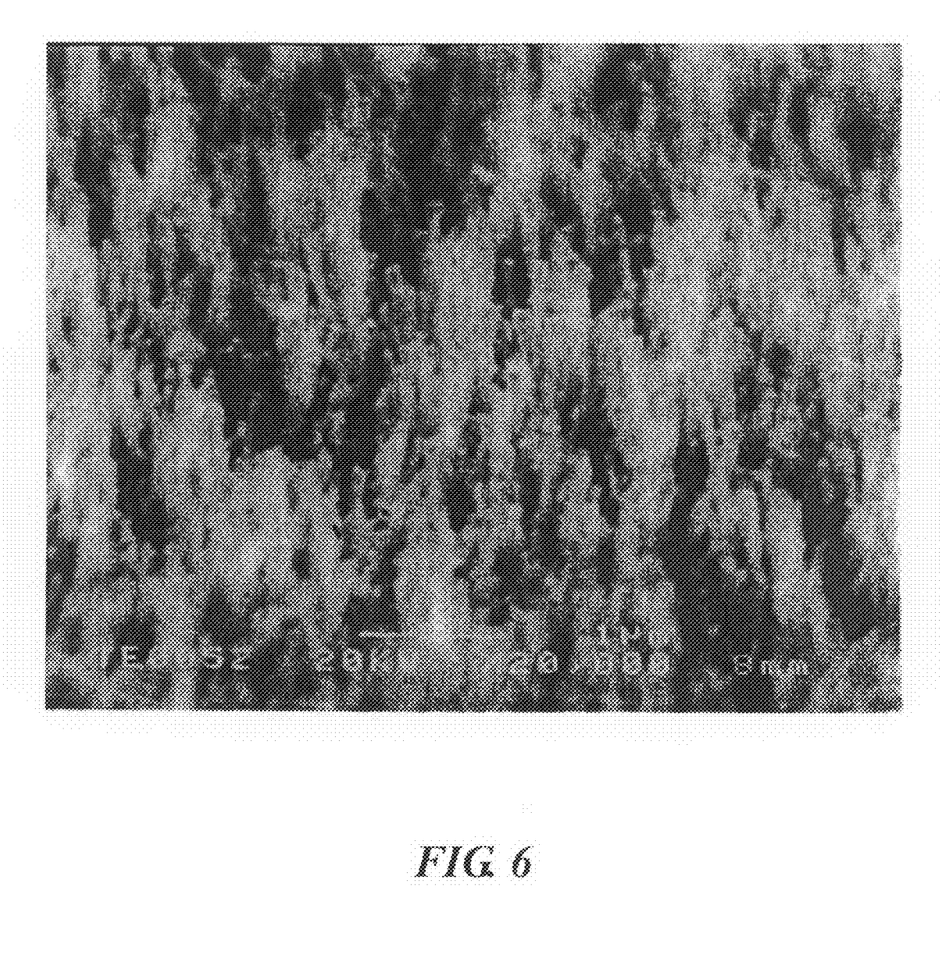
FIG. 6 is an SEM photograph showing carbon nanotubes manufactured in Example 6 of the present invention.

FIG. 6 shows an SEM photograph of carbon nanotubes obtained in Example 6. As shown in FIG. 6, the carbon nanotubes were perpendicularly and densely deposited on the substrate 105.

Example 7

Figure 7:
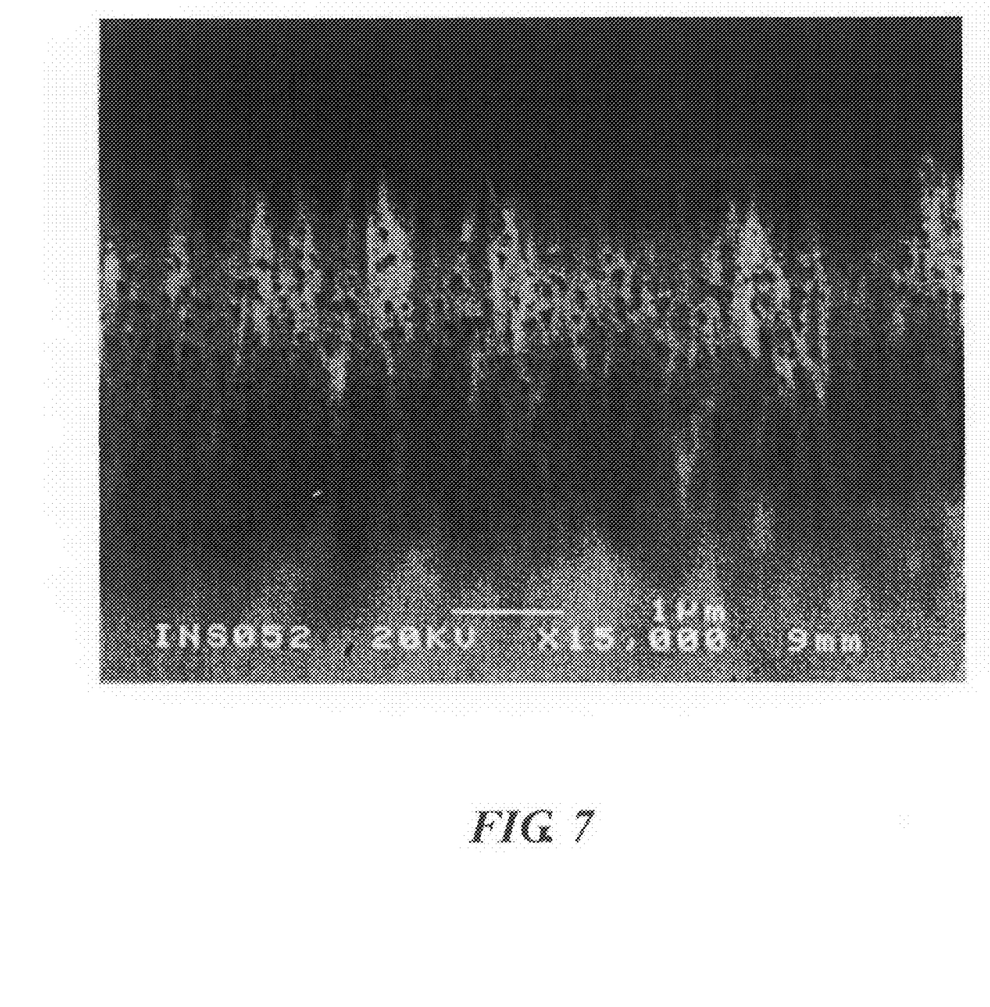
FIG. 7 is an SEM photograph showing carbon nanotubes manufactured in Example 7 of the present invention.

An experiment was conducted under the same conditions (distance between the anode and the substrate and the like) as in Example 1. However, benzene was used instead of acetylene gas. FIG. 7 shows an SEM photograph of the resulting carbon nanotubes. As shown in FIG. 7, the carbon nanotubes were perpendicularly and densely deposited on the substrate 105.

Example 8

An experiment was conducted under the same conditions (distance between the anode and the substrate and the like) as in Example 1. However, the flow rate of hydrogen gas was set at 20 sccm/s and the flow rate of acetylene gas was set at 0.8 sccm/s. An SEM photograph of the resulting carbon nanotubes was the same as in Example 1.

As described above, according to the present invention, carbon nanotubes perpendicularly and densely deposited on a substrate can be provided without excessively increasing the temperature of the substrate.

Moreover, a method of manufacturing carbon nanotubes which are uniformly deposited over a wide area, have a regular crystal structure, and are aligned perpendicularly to a substrate can be provided, even if the temperature of the substrate is 500° C. or less.

Furthermore, an electron emission source excelling in electron emission characteristics obtained by using the carbon nanotubes and a display using the electron emission source can be provided. An excellent flat display can be manufactured by using the field emission source as an electron emission source of a field emission display.

Obviously, numerous modifications and variations of the present invention are possible in light of the above teachings. It is therefore to be understood that, within the scope of the appended claims, the invention may be practiced otherwise than as specifically described herein.

What is claimed is:

1. A method of manufacturing carbon nanotubes comprising supplying alternating-current power at a specific frequency between an anode and a cathode disposed in a reactor, and causing plasma to be generated between the anode and the cathode by introducing mixed gas containing an aliphatic hydrocarbon having 1-5 carbon atoms and hydrogen or mixed gas containing an aromatic hydrocarbon and hydrogen, so as to deposit carbon nanotubes on a substrate disposed between the anode and the cathode and held at a distance two times or less of the mean free path of a hydrocarbon cation from the anode, wherein a magnetic field is applied by disposing a magnet so that magnetic force occurs in a direction perpendicular to the substrate.

2. The method of manufacturing carbon nanotubes according to claim 1, wherein the distance between the anode and the substrate is 20 cm or less.

3. The method of manufacturing carbon nanotubes according to claim 1, wherein the distance between the anode and the substrate is 10 cm or less.

4. The method of manufacturing carbon nanotubes according to claim 1, wherein the specific frequency is 13.56 MHz.

5. The method of manufacturing carbon nanotubes according to claim 1, wherein the aliphatic hydrocarbon having 1-5 carbon atoms is a saturated aliphatic hydrocarbon having 1-5 carbon atoms.

6. The method of manufacturing carbon nanotubes according to claim 1, wherein the aromatic hydrocarbon is benzene, toluene, or xylene.

7. The method of manufacturing carbon nanotubes according to claim 1, wherein a metal, an alloy, a metal complex, or a metal compound is caused to adhere to the substrate as a catalyst.

8. The method of manufacturing carbon nanotubes according to claim 7, wherein the catalyst comprises at least one member selected from the group consisting of iron, cobalt, nickel, tungsten, platinum, rhodium, and palladium.

9. The method of manufacturing carbon nanotubes according to claim 1, wherein the pressure of the mixed gas is 1 to 50 Pa.

10. The method of manufacturing carbon nanotubes according to claim 1, wherein the aliphatic hydrocarbon having 1-5 carbon atoms is an unsaturated aliphatic hydrocarbon having 1-5 carbon atoms.

* * * * *

UNITED STATES PATENT AND TRADEMARK OFFICE
CERTIFICATE OF CORRECTION

PATENT NO. : 7,511,206 B2
APPLICATION NO. : 11/267314
DATED : March 31, 2009
INVENTOR(S) : Hiroyuki Hiraoka et al.

Page 1 of 1

It is certified that error appears in the above-identified patent and that said Letters Patent is hereby corrected as shown below:

On the title page, Item 30, please insert the Foreign Application Priority Data. Item 30 should read:

--(30) Foreign Application Priority Data:
    Sep. 25, 2001 (JP) 2001-333529--

Signed and Sealed this

Second Day of June, 2009

JOHN DOLL
*Acting Director of the United States Patent and Trademark Office*